United States Patent [19]

Ohto

[11] Patent Number: 4,989,264

[45] Date of Patent: Jan. 29, 1991

[54] BANDWIDTH LIMITING CIRCUIT WITH VARIABLE BANDWIDTH

[75] Inventor: Hideki Ohto, Fukaya, Japan

[73] Assignee: Kabushiki Kaisha Toshiba, Japan

[21] Appl. No.: 249,990

[22] Filed: Sep. 27, 1988

[30] Foreign Application Priority Data

Sep. 30, 1987 [JP] Japan .................. 62-246018

[51] Int. Cl.⁵ .............................. H04B 1/06
[52] U.S. Cl. .......................... 455/266; 455/339; 455/340; 333/178; 333/193
[58] Field of Search ............... 455/4, 6, 200, 254, 455/266, 339, 340, 209, 246, 248, 191, 189; 333/172, 174–175, 178–179, 193

[56] References Cited

U.S. PATENT DOCUMENTS

| | | | |
|---|---|---|---|
| 4,030,036 | 6/1977 | Kusano | 455/266 |
| 4,153,887 | 5/1979 | Poppa | 455/340 |
| 4,262,361 | 4/1981 | Hauer | 455/266 |
| 4,339,828 | 7/1982 | Chasek | 455/266 |
| 4,528,698 | 7/1985 | Fraser | 455/266 |
| 4,551,755 | 11/1985 | Matsuda et al. | 455/266 |
| 4,563,651 | 1/1986 | Ohta et al. | 455/266 |
| 4,792,993 | 12/1988 | Ma | 455/266 |

Primary Examiner—Reinhard J. Eisenzopf
Assistant Examiner—Andrew Faile
Attorney, Agent, or Firm—Cushman, Darby & Cushman

[57] ABSTRACT

Upper and lower limiting side LC series resonance circuits having resonance frequencies near the upper and lower limiting frequencies of the bandwidth of a surface acoustic wave (SAW) filter as a bandpass filter (BPF) having a fixed passing bandwidth are connected to the BPF. The upper limiting side LC series resonance circuit has a coil connected at one end to the output terminal of the SAW filter (BPF), and a variable capacity diode connected at its anode to the other end of the coil. A control voltage is applied to one end of the coil, and a constant voltage higher than the control voltage is applied to the cathode of the variable capacity diode. The lower limiting side LC series resonance circuit has a coil connected at its one end to the output terminal of the BPF, and a variable capacity diode connected at its cathode to the other end of the coil and grounded at its anode. The control voltage is applied to the one end of the each coil, the resonance frequencies of the upper and lower limiting side LC series resonance circuits are varied by altering the voltage value of the control voltage to further variably limit the bandwidth of the signal limited by the BPF.

15 Claims, 4 Drawing Sheets

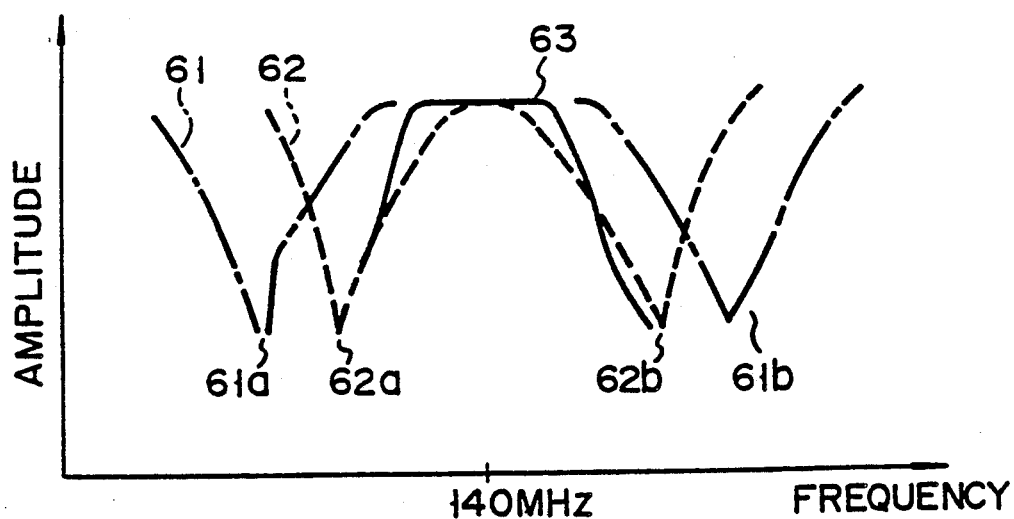
F I G. 5
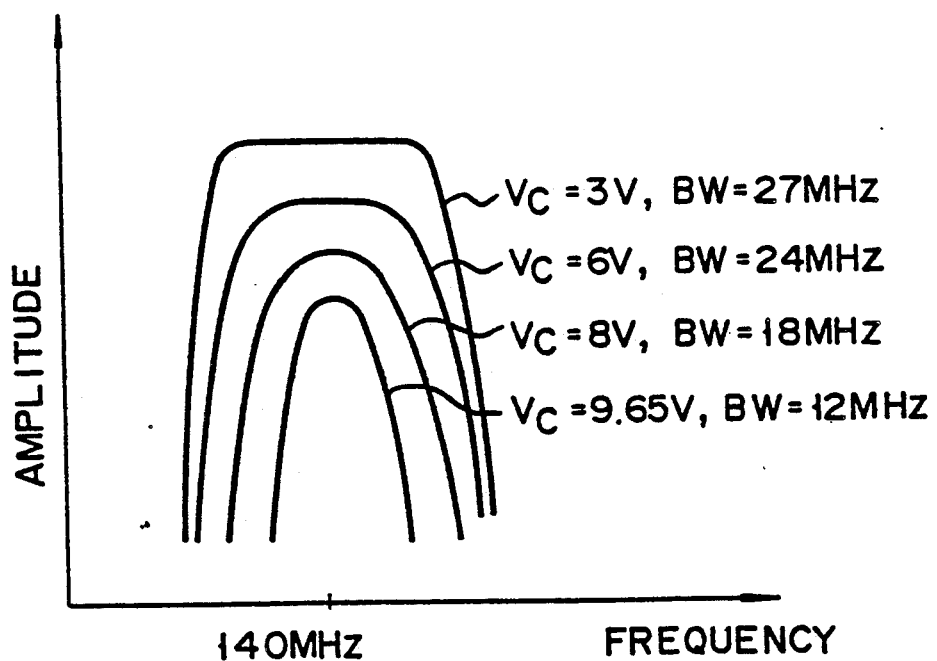
F I G. 6

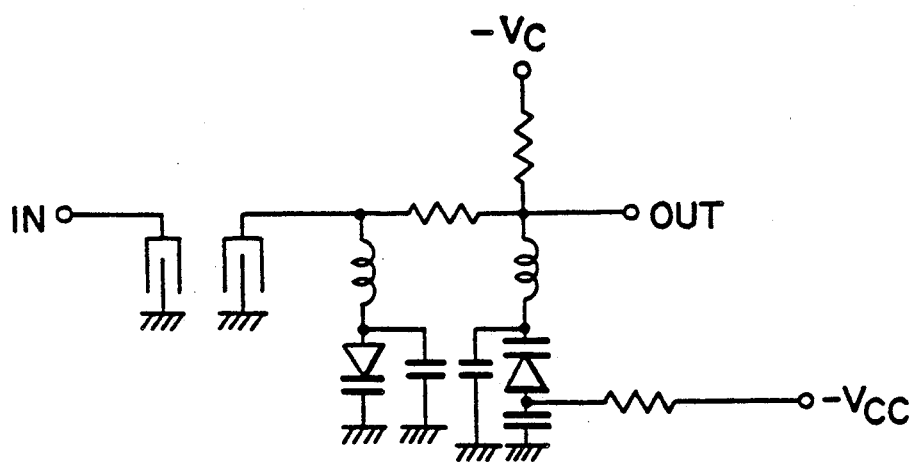
F I G. 7

BANDWIDTH LIMITING CIRCUIT WITH VARIABLE BANDWIDTH

BACKGROUND OF THE INVENTION

1. Field of the Invention

This invention relates to a bandwidth limiting circuit having a variable bandwidth, which is adapted to vary the passband width of the second intermediate frequency (IF) stage of the converter incorporated in the indoor unit of, for example, a satellite-broadcasting receiver.

2. Description of the Related Art

Satellite-broadcasting receivers, such as television receiving-only (TVRO) receivers, are widely used in the United States. The receiver has an antenna, a low-noise blockdown converter, and an indoor unit. When the antenna receives the frequency-modulated (FM) wave of 3.7 to 4.2 GHz transmitted from a communications satellite, the converter converts this wave into a first IF signal of 0.95 to 1.45 GHz. The first IF signal is supplied to the indoor unit.

The indoor unit comprises a mixer circuit, a local oscillator, a bandpass filter (BPF), and an FM demodulator. The mixer circuit converts the first IF signal to a second IF signal of 140 MHz, by using the output of the local oscillator. The bandpass filter limits the bandwidth of the second IF signal to 27 MHz. The FM demodulator demodulates the frequency of the 27 MHz signal, thereby generating a video signal.

The output bandwidth of the satellite used at present is 36 MHz. Therefore, the bandwidth of the BPF should ideally be set to this frequency. However, as has been stated, this bandwidth is actually 27 MHz for the following reason.

The output noise power $N_0$ of the receiver is:

$$N_0 = K \cdot T \cdot B \cdot F$$

where,

K: Boltzmann's constant
T: absolute temperature
B: bandwidth of the BPF
F: noise factor of the receiver When B is too broad, the carrier/noise (C/N) ratio of the receiver is too small. On the other hand, when B is too narrow, the BPF will delete some part of the input signal, inevitably generating a truncation noise. It has been found that the trade-off value for B is about 27 MHz. This is why a BPF having a bandwidth of 27 MHz is used in the indoor unit of the satellite-broadcasting receiver.

Besides, as is well known in the art, the meteorological changes results in changes in the C/N ratio of the FM waves, i.e., the input signals of the TVRO receivers. Some measures must therefore be taken to cope with the changes in the C/N ratio. Further, in addition to satellites which transmit FM waves of 3.7 to 4.2 GHz, communications satellites are also used which transmit FM waves of 12 GHz. To convert 12 GHz FM waves into video signals, the TVRO receiver must have a BPF whose bandwidth is in the vicinity of 24 MHz.

In the United States, the ground microwave telephone channel uses a frequency close to the central frequency of the TVRO receiver, i.e., $140 \pm 10$ MHz. Hence, the TVRO receiver may interfere with the telephone microwaves in some areas. To prevent such interference, a notch filter of $140 \pm 10$ MHz, which has a great Q value, is incorporated at the rear stage of the BPF (27 MHz) which is the second IF stage of the TVRO receiver. The use of the notch filter, however, causes a problem. Since the bandpass width of the second IF stage (i.e., the BPF) of the TVRO receiver is fixed at 27 MHz, the TVRO receiver cannot cope with all FM waves which have different C/N ratios because of the difference in their frequencies (4 GHz and 12 GHz) and also because of the meteorological changes influencing them. The notch filter provided in the second IF stage inevitably cuts off the input signal of any channel other than the interfered one is inevitably cut off.

In order to prevent such an unnecessary cut-off of input signal, a new type of a TVRO receiver has been developed, in which the BPF is replaced by two surface acoustic wave (SAW) filters having different bandpass widths, and these SAW filters are alternatively used. Needless to say, this TVRO receiver requires a means for selecting the first SAW filter or the second SAW filter, is thus complex, and therefore expensive.

SUMMARY OF THE INVENTION

Accordingly, an object of this invention is to provide a bandwidth limiting circuit whose bandwidth can be varied in accordance with a change in the C/N ratio of an input signal, and which does not cut off the input signal of any channel not interfered with other signals.

An another object of this invention is to provide an indoor unit of a satellite broadcasting receiver having such as an above bandwidth limiting circuit with variable bandwidth.

According to one aspect of this invention, there is provided a bandwidth limiting circuit with variable bandwidth comprising an input terminal for receiving an input signal to be limited in the bandwidth; an output terminal for outputting an output signal limited in its bandwidth; bandpass filter means with fixed passing bandwidth connected between the input terminal and the output terminal for limiting the bandwidth of the input signal to output the same; first resonance circuit means connected to the bandpass filter means, the first resonance circuit means receiving a control voltage and having a resonance frequency varying in proportion to the control voltage, the resonance frequency having a frequency near the upper limiting frequency of the passing band of the bandpass filter means; and second resonance circuit means connected to the bandpass filter means, the second resonance circuit means receiving the control voltage and having a resonance frequency varying reverse to the varying direction of the first resonance circuit means in proportion to the control voltage, the resonance frequency having a frequency near the lower limiting frequency of the passing band of the bandpass filter means.

According to another aspect of this invention, there is provided an indoor unit of a satellite broadcasting receiver comprising means for receiving a first intermediate frequency signal; local oscillator means for generating a oscillation signal; mixer means for mixing the first intermediate frequency signal received by the receiving means and the oscillation signal generated by the local oscillator means to obtain a second intermediate frequency signal; bandwidth limiting means with variable bandwidth for limiting the second intermediate frequency signal to a desired bandwidth, the bandwidth limiting means including an input terminal for receiving the second intermediate frequency signal obtained by the mixer means, an output terminal for outputting the second intermediate frequency signal limited in its bandwidth, a bandpass filter with fixed passing bandwidth connecting between the input terminal and the output terminal for limiting the bandwidth of the input second intermediate frequency signal to output the same, a first resonance circuit connected to the bandpass filter, the first resonance circuit receiving a control voltage and having a resonance frequency varying in proportion to the control voltage, the resonance frequency having a frequency near the upper limiting frequency of the passing band of the bandpass filter, and a second resonance circuit connected to the bandpass filter, the second resonance circuit receiving the control voltage and having a resonance frequency varying reverse to the varying direction of the first resonance circuit in proportion to the control voltage, the resonance frequency having a frequency near the lower limiting frequency of the passing band of the bandpass filter; and demodulating means for demodulating the second intermediate frequency signal limited in its bandwidth by the bandwidth limiting means to obtain a video signal.

BRIEF DESCRIPTION OF THE DRAWINGS

FIGS. 5 and 6 are graphs showing the operation of the bandwidth limiting circuit in FIG. 4; and FIG. 7 is a circuit diagram showing an arrangement of another embodiment of a bandwidth limiting circuit with variable bandwidth according to this invention.

DETAILED DESCRIPTION OF THE PREFERRED EMBODIMENTS

Figure 1:
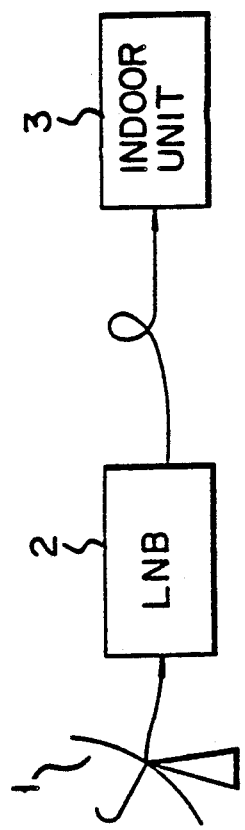
FIG. 1 is a block diagram showing an arrangement of a TVRO receiver.

FIG. 1 is a view showing an arrangement of a television receiving-only (TVRO) receiver to which a bandwidth limiting circuit with variable bandwidth according to this invention is able to be applied. In the TVRO receiver, an FM wave of 3.7 to 4.2 GHz received at antenna 1 is converted to a first intermediate frequency (IF) signal of frequency band of 0.95 to 1.45 GHz by means of low noise blockdown converter (LNB) 2. The converted first IF signal is supplied to indoor unit 3.

Figure 2:
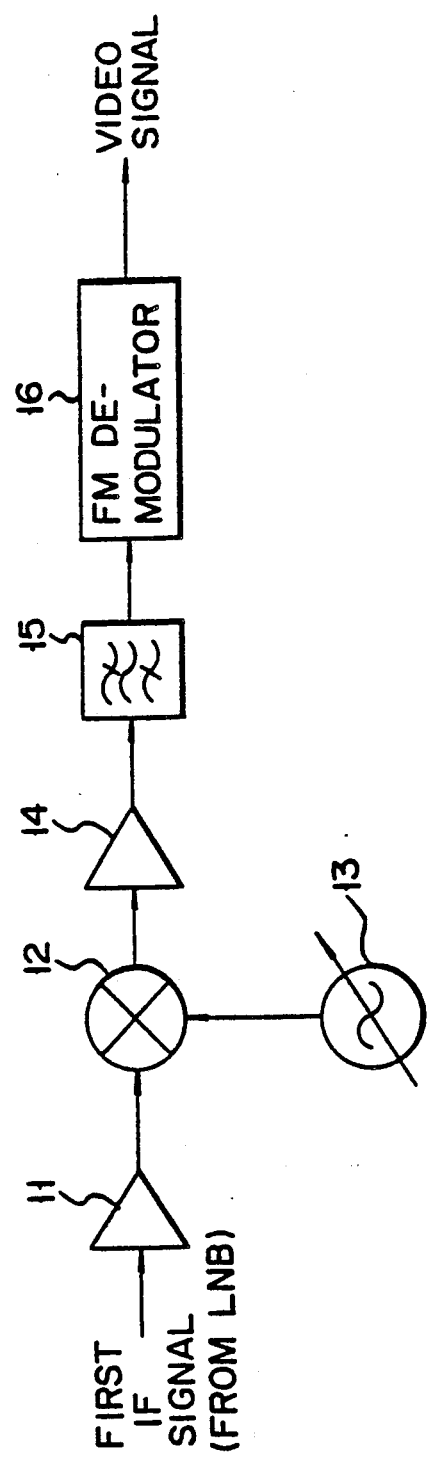
FIG. 2 is a block diagram showing an arrangement of an indoor unit in FIG. 1.

In indoor unit 3, as is shown in FIG. 2, the supplied first IF signal is supplied to mixer 12 through first IF amplifier 11. The oscillation output of local oscillator 13 is supplied to mixer 12, which mixes the oscillation output and the first IF signal. More specifically, mixer 12 converts the first IF signal to a second IF signal of 140 MHz by using the oscillation output. The second IF signal is fed to bandwidth limiting circuit 15 through second IF amplifier 14. The bandwidth limiting circuit with variable bandwidth according to this invention is able to be applied to bandwidth limiting circuit 15. The second IF signal fed through bandwidth limiting circuit 15 is supplied to FM demodulator 16. FM demodulator 16 frequency-demodulates the supplied second IF signal and outputs it as a video signal.

Figure 3:
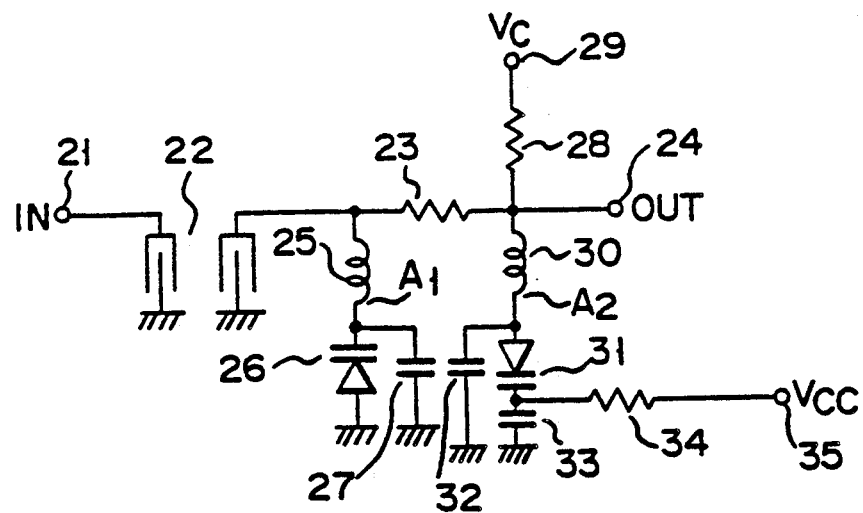
FIG. 3 is a circuit diagram showing an arrangement of an embodiment of a bandwidth limiting circuit with variable bandwidth according to this invention.

Bandwidth limiting circuit 15 to which this invention is applied will be described. This bandwidth limiting circuit 15 with variable bandwidth according to this invention limits the second IF signal to a desired bandwidth within a range of 12 to 27 MHz. Bandwidth limiting circuit 15 is constituted as is shown in FIG. 3. More specifically, the second IF signal supplied from mixer 12 through second IF amplifier 14 is applied to input terminal 21 of bandpass limiting circuit 15. Input terminal 21 is connected to the input terminal of surface acoustic wave (SAW) filter 22 which forms a bandpass filter (BPF) having a fixed passing bandwidth. The output terminal of SAW filter 22 is connected to output terminal 24 of bandwidth limiting circuit 15 through resistor 23. A node of the output terminal of SAW filter 22 and one end of resistor 23 is connected to one end of coil 25. The other end of coil 25 is connected to the cathode of variable capacity diode (varactor diode) 26 and grounded through capacitor 27. The anode of variable capacity diode 26 is grounded.

The other end of resistor 23 is connected to control voltage terminal 29 to which control voltage $V_c$ is applied through resistor 28. Further, the other end of resistor 23 is also connected to one end of coil 30. The other end of coil 30 is connected to the anode of variable capacity diode (varactor diode) 31 and grounded through capacitor 32. The cathode of variable capacity diode 31 is grounded through capacitor 33, and connected to power source terminal 35 to which predetermined (+12 V) operating voltage $V_{cc}$ is applied through resistor 34. It is desirable that variable capacity diodes 26 and 31 must have the same characteristics.

In bandwidth limiting circuit 15 with variable bandwidth of the arrangement described above, the second IF signal input to input terminal 21 is supplied to SAW filter 22 having a fixed bandwidth to be limited to 27 MHz of normal bandwidth. If an input electric field is normal and there is no disturbing wave or jamming, a control voltage of approx. 2 V is supplied to control voltage terminal 29. At this time, the resonance frequency of LC series resonance circuit $A_1$ having coil 25, variable capacity diode 26, and capacitor 27 is out of lower sideband of passing band of SAW filter 22. The resonance frequency of LC series resonance circuit $A_2$ having coil 30, variable capacity diode 31, and capacitors 32, 33 is out of upper sideband of passing band of SAW filter 22. Therefore, LC series resonance circuits $A_1$ and $A_2$ do not affect the influence to the characteristics of SAW filter 22.

In bandwidth limiting circuit 15 with variable bandwidth of the arrangement described above, the bandwidth can be varied by altering the voltage value of control voltage $V_c$ applied to control voltage terminal 29. For example, if an input electric field is low or its band is desired to be narrowed due to a disturbing wave, the voltage value of control voltage $V_c$ applied to control voltage terminal 29 may be raised. In other words, when control voltage $V_c$ is raised, the capacity of variable capacity diode 26 is reduced. Therefore, resonance frequency of lower limiting side LC series resonance circuit $A_1$ rises. When control voltage $V_c$ is raised, the capacity of variable capacity diode 31 is increased. Thus, the resonance frequency of upper limiting side LC series resonance circuit $A_2$ falls. In this manner, the passing bandwidth of second IF stage is narrowed in the form interposed between both notch filters, thereby improving the quality of the video signal on a display screen.

When control voltage $V_c$ applied to control voltage terminal 29 is attained, for example, from the control circuit of an automatic gain controller, its passing bandwidth can be automatically altered in response to the input electric field.

The reason the SAW filter is used as BPF is that the SAW filter is not subject to the influence of an impedance variation by a trap, since the SAW filter has a high impedance.

The bandwidth limiting circuit of this embodiment described above has lower limiting side LC series resonance circuit $A_1$ having a resonance frequency near the lower limiting frequency of SAW filter 22 having fixed passing bandwidth, and upper limiting side LC series resonance circuit $A_2$ similarly having a resonance frequency near the upper limiting frequency. Control voltage $V_c$ is applied from control voltage terminal 29 to the cathode of variable capacity diode 26 which operates as the capacity element of lower limiting side LC series resonance circuit $A_1$. A constant voltage higher than the upper limiting voltage of control voltage $V_c$ is applied to the cathode of variable capacity diode 31 of upper limiting side LC series resonance circuit $A_2$, and control voltage $V_c$ is applied to the anode. The passing band width can be varied by altering the voltage value of control voltage $V_c$.

According to the arrangement described above, the resonance frequencies of LC series resonance circuits $A_1$ and $A_2$ are varied by altering the voltage value of control voltage $V_c$ applied to control voltage terminal 29. Therefore, the entire passing band width can be reduced smaller than the passing bandwidth of BPF 22 by suitably setting control voltage $V_c$. Thus, the passing bandwidth can be freely varied to accommodate to C/N change of the input signal and to eliminate the cut of the signal in the channel which does not receive a disturbance.

Figure 4:
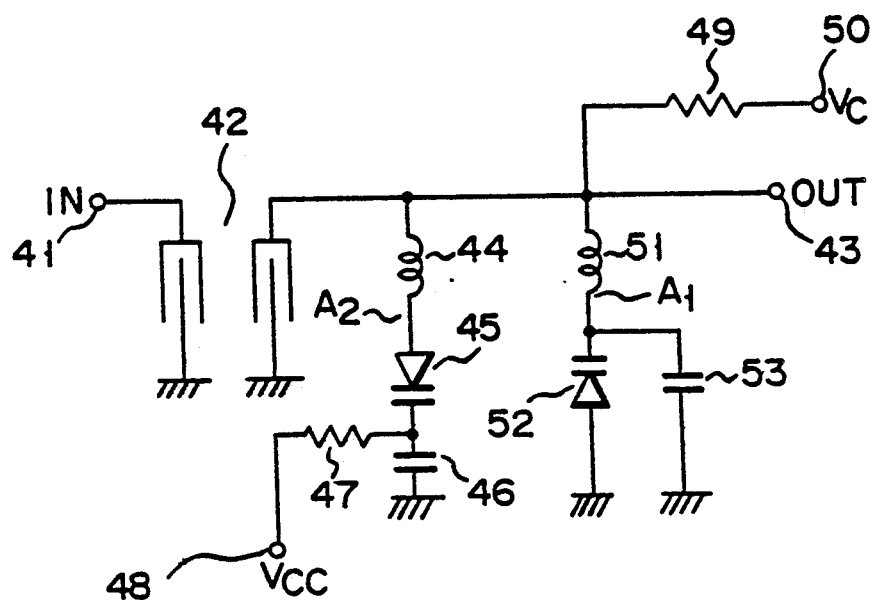
FIG. 4 is a circuit diagram showing an arrangement of an actual example of a bandwidth limiting circuit of the invention.

Actual circuit example and actually measured results will be described with reference to FIGS. 4 to 6. In FIG. 4, a second IF wave is applied to input terminal 41. Input terminal 41 is connected to the input terminal of SAW filter 42 as a BPF of 140 MHz of central frequency and 27 MHz of bandwidth at 3 dB. The output terminal of SAW filter 42 is connected to output terminal 43. The output terminal of SAW filter 42 is also connected to one end of coil 44. The other end of coil 44 is connected to the anode of variable capacity diode (varactor diode) 45. The cathode of variable capacity diode 45 is grounded via capacitor 46 and connected to power terminal 48 to which predetermined ($+12$ V) operating voltage $V_{cc}$ is applied through resistor 47.

The output terminal of SAW filter 42 is connected to control voltage terminal 50 to which control voltage $V_c$ is applied through resistor 49. The output terminal of SAW filter 42 is connected to one end of coil 51. The other end of coil 51 is connected to the cathode of variable capacity diode (varactor diode) 52, and grounded through capacitor 53. The anode of variable capacity diode 52 is grounded.

The circuit in FIG. 4 narrows the bandwidth by deleting the shoulder characteristics of SAW filter 42 by utilizing the tailing characteristic of the lower side of a trap frequency by lower limiting side LC series resonance circuit $A_1$ formed of coil 51, variable capacity diode 52, and capacitor 33 and the tailing characteristic of the upper side of a trap frequency by upper limiting side LC series resonance circuit $A_2$ formed of coil 44, variable capacity diode 45, and capacitor 46. In other words, as is shown by characteristic curve 61 in FIG. 5, when the upper and lower trap frequencies are sufficiently separated with respect to 140 MHz as designated by symbols 61a and 61b, the characteristic of SAW filter 42 is as original as designated by characteristic curve 63. On the other hand, when both the trap frequencies approach as designated by symbols 62a and 62b, narrower bandwidth than that of SAW filter 42 is obtained as designated by characteristic curve 62.

The difference between the circuits in FIG. 3 and FIG. 4 resides only in that resistor 23 and capacitor 32 of FIG. 3 are not provided in the circuit of FIG. 4. Resistor 23 is of an attenuator for removing an interference between LC series resonance circuits $A_1$ and $A_2$, and capacitor 32 is for regulating the varying sensitivity of the bandwidth.

Then, a method for determining the circuit constants of the circuit in FIG. 4 will be described. In the above-mentioned principle, the following two conditions must be satisfied so as to determine the circuit constants.
(1) The tailing characteristics of upper and lower side traps are equivalent; and
(2) both the traps are varied at an equal frequency interval with respect to the central frequency (but only in the bandwidth of 27 MHz).

In order to satisfy the condition (1), it is necessary to match the characteristics of both LC series resonance circuits $A_1$ and $A_2$. This can be solved by using variable capacity diodes 45, 52 varying in capacity values having low Q coils as coils 44, 51 and substantially equalizing the inductances of both the coils 44 and 51.

As to the condition (2), it is described by FIG. 4 and concrete numerals Diodes model 1SV153 made by Toshiba Corporation are used as variable capacity diodes 45, 52, 12 V is applied as a common bias to power terminal 48, and approx. $6\pm3$ V is considered as variable voltage range $V_x$. Then, the capacity value $C_d$ of variable capacity diodes 45, 52 are given by the following Table.

| $V_x$ (V) | $C_d$ (pF) |
|---|---|
| 3 | 12.6 |
| 4 | 10.9 |
| 5 | 9.6 |
| 6 | 8.5 |
| 7 | 7.6 |
| 8 | 6.9 |
| 9 | 6.2 |

When PU wires of 0.4 mm in diameter are used as coils 44, 51, upper side resonance frequency fh and lower side resonance frequency fl when the central frequency is 140 MHz and the bandwidth is 20 MHz are respectively approx. 165 MHz and 117 MHz. For example, to obtain frequencies fh and fl so as to satisfy control voltage $V_c = 8$ V, the inductance of coils 44, 51 and the capacity values of capacitors 46, 53 are determined by the following. In this case, it is necessary to set the inductances of coils 44, 52 to the same value.

$$\frac{1}{2\pi \sqrt{\frac{C_{d1} \times C_x}{C_{d1} + C_x} \cdot L}} = 165 \times 10^6 \quad (2)$$

$$\frac{1}{2\pi \sqrt{(C_{d2} + C_y) \cdot L}} = 117 \times 10^6 \quad (3)$$

where
- $C_{d1}$, $C_{d2}$: capacity values of variable capacity diodes 45, 52,
- $C_x$: capacity value of capacitor 46
- $C_y$: capacity value of capacitor 53
- $L$: inductances of coils 44, 51.

Here, since control voltage $V_c=8$ V, a voltage of $(12-8=)$ 4 V is applied between the cathode and the anode of variable capacity diode 45. Thus, variable voltage range $V_x=4$ V. Therefore, capacity value $C_{d1}$ of variable capacity diode 45 becomes $C_{d1}=10.9\times10^{-12}F$. Since the voltage of 8 V is applied between the cathode and the anode of variable capacity diode 52, its variable voltage range $V_x=8$ V is obtained. Therefore, the capacity value $C_{d2}$ of variable capacity diode 52 becomes $C_{d2}=6.9\times10^{-12}F$. Consequently, the above equations (2) and (3) become:

$$\frac{1}{2\pi\sqrt{\frac{10.9\times10^{-12}\times C_x}{10.9\times10^{-12}+C_x}\cdot L}} = 165\times10^6 \quad (4)$$

$$\frac{1}{2\pi\sqrt{(6.9\times10^{-12}+C_y)\cdot L}} = 117\times10^6 \quad (5)$$

Since the condition that the varying amounts of trap frequencies are constant at the upper and lower sides must be satisfied when control voltage $V_c$ is varied from 8 V to 9 V, the following equation is obtained:

$$165\times10^6 - \left(\frac{1}{2\pi\sqrt{\frac{12.6\times10^{-12}\times C_x}{12.6\times10^{-12}+C_x}\cdot L}}\right) = \quad (6)$$

$$\frac{1}{2\pi\sqrt{(6.2\times10^{-12}+C_y)\cdot L}} - 117\times10^6$$

Therefore, the capacity values $C_x$, $C_y$ of coils 44, 54 and capacitors 46, 53 can be obtained by solving the simultaneous equations (4), (5), and (6).

In the embodiment, the bandwidth can be varied as is shown in FIG. 6 by using:
- $L=200$ nH
- $C_x=8$ pF
- $C_y=2.5$ pF.

More specifically, the bandwidth can be varied in a range of 12 to 27 MHz by control voltage $V_c$ of range of 3 to 9 V.

Although this invention has been explained as being applied to the embodiment, this invention is not limited to the particular embodiments. Various other changes and modifications may be made within the spirit and scope of this invention. For example, in the embodiment described above, positive voltages were applied as control voltage $V_c$ and power voltage $V_{cc}$. However, negative voltage may also be applied. In this case, however, as is shown in FIG. 7, it is necessary to replace the directions of the cathodes and the anodes of both the variable capacity diodes.

What is claimed is:

1. A bandwidth limiting circuit with a variable bandwidth comprising:
    an input terminal for receiving an input signal whose bandwidth is to be limited;
    an output terminal for outputting a bandwidth-limited output signal;
    a control terminal for receiving a control voltage;
    bandpass filter means with a fixed passing bandwidth connected between said input terminal and said output terminal for limiting the bandwidth of the input signal to output said bandwidth-limited signal;
    first resonance circuit means connected to said bandpass filter means and said control terminal, for receiving the control voltage from said control terminal and trapping a first trapping frequency near the upper limiting frequency of the passing band of said bandpass filter means, said first trapping frequency varying in proportion to the control voltage; and
    second resonance circuit means connected to said bandpass filter means and said control terminal for receiving the control voltage from said control terminal, and trapping a second trapping frequency near the lower limiting frequency of the passing band of the bandpass filter means the second trapping frequency varying reverse to the varying direction of said first resonance circuit means in proportion to the control voltage.

2. The bandwidth limiting circuit according to claim 1, wherein said bandpass filter means includes a surface acoustic wave filter.

3. A bandwidth limiting circuit with a variable bandwidth comprising:
    an input terminal for receiving an input signal to be limited in bandwidth;
    an output terminal for outputting a bandwidth limited output signal;
    bandpass filter means, which includes a surface acoustic wave filter with a fixed passing bandwidth connected between said input terminal and said output terminal for limiting the bandwidth of the input signal to output the same;
    first resonance circuit means connected to said bandpass filter means, said first resonance circuit means receiving a control voltage and having a resonance frequency varying in proportion to the control voltage, said resonance frequency having a frequency near the upper limiting frequency of the passing band of said bandpass filter means; and
    second resonance circuit means connected to said bandpass filter means, said second resonance circuit means receiving the control voltage and having a resonance frequency varying reverse to the varying direction of said first resonance circuit means in proportion to the control voltage, said resonance frequency having a frequency near the lower limiting frequency of the passing band of the bandpass filter means;
    wherein said first resonance circuit means includes an upper limiting side LC series resonance circuit having at least one variable capacity diode as a capacity element, said variable capacity diode varying its capacity value in response to said control voltage, and
    said second resonance circuit means includes a lower limiting side LC series resonance circuit having at least one variable capacity diode as a capacity element, said variable capacity diode being connected reverse to a direction of connection of said variable capacity diode in said upper limiting side LC series resonance circuit, and varying its capacity value in response to said control voltage.

4. A bandwidth limiting circuit according to claim 3, wherein said upper limiting side LC series resonance circuit is connected at its one end between said surface acoustic wave filter and said output terminal, and a voltage proportional to said control voltage is applied between both ends, and said lower limiting side LC series resonance circuit is connected at its one end between side surface acoustic wave filter and said output terminal, and said control voltage is applied between both ends.

5. The bandwidth limiting circuit according to claim 4, wherein said upper limiting side LC series resonance circuit includes a first coil connected at its one end to said output terminal and applied with said control voltage of positive voltage value thereto, and a first variable capacity diode connected at its anode to the other end of said first coil and applied at its cathode with a constant voltage of positive voltage value higher than said control voltage, and said lower limiting side LC series resonance circuit includes a second coil connected at its one end to said output terminal and applied with said control voltage thereto, and a second variable capacity diode connected at its cathode to the other end of said second coil and connected at its anode to a reference potential terminal.

6. The bandwidth limiting circuit according to claim 5, wherein said control voltage includes a predetermined voltage value in which said upper and lower limiting side LC series resonance circuits do not affect an influence to a signal passed through said surface acoustic wave filter.

7. The bandwidth limiting circuit according to claim 5, wherein the resonance frequencies of said upper and lower limiting side LC series resonance circuits vary in a direction approaching the central frequency of said surface acoustic wave filter as the voltage value of said control voltage rises.

8. The bandwidth limiting circuit according to claim 7, wherein the resonance frequencies of said upper and lower limiting side LC series resonance circuits vary proportionally to each other in response to the variation of the voltage value of said control voltage.

9. The bandwidth limiting circuit according to claim 4, wherein said upper limiting side LC series resonance circuit includes a first coil connected at its one end to said output terminal and applied with said control voltage of negative voltage value thereto, and a first variable capacity diode connected at its cathode to the other end of said first coil and applied at its anode with a constant voltage of negative voltage value lower than said control voltage, and said lower limiting side LC series resonance circuit includes a second coil connected at its one end to said output terminal and applied with said control voltage thereto, and a second variable capacity diode connected at its anode to the other end of said second coil and connected at its cathode to a reference potential terminal.

10. The bandwidth limiting circuit according to claim 9, wherein said control voltage includes a predetermined voltage value in which said upper and lower limiting side LC series resonance circuits do not affect an influence to a signal passed through said surface acoustic wave filter.

11. The bandwidth limiting circuit according to claim 9, wherein the resonance frequencies of said upper and lower limiting side LC series resonance circuits vary in a direction approaching the central frequency of said surface acoustic wave filter as the voltage value of said control voltage falls.

12. The bandwidth limiting circuit according to claim 11, wherein the resonance frequencies of said upper and lower limiting side LC series resonance circuits vary proportionally to each other in response to the variation of the voltage value of said control voltage.

13. An indoor unit of a satellite broadcasting receiver comprising:

means for receiving a first intermediate frequency signal;

local oscillator means for generating an oscillation signal;

mixer means for mixing the first intermediate frequency signal received by said receiving means and the oscillation signal generated by said local oscillator means to obtain a second intermediate frequency signal;

a control terminal for receiving a control voltage;

bandwidth limiting means, having a variable bandwidth, for limiting the second intermediate frequency signal to a desired bandwidth, said bandwidth limiting means including:

an input terminal for receiving the second intermediate frequency signal obtained by said mixer means;

an output terminal for outputting the second intermediate frequency signal limited in its bandwidth;

a bandpass filter with a fixed passing bandwidth connecting between said input terminal and said output terminal for limiting the bandwidth of the input second intermediate frequency signal to output the same;

a first resonance circuit connected to said bandpass filter and said control terminal, said first resonance circuit receiving said control voltage and having a trapping frequency near one of the upper and lower limiting frequencies of the passing band of said bandpass filter, said tripping frequency varying in proportion to the control voltage; and a second resonance circuit connected to said bandpass filter and said control terminal, said second resonance circuit receiving the control voltage and having a trapping frequency near the other of the upper and lower limiting frequencies of the passing band of said bandpass filter, said trapping frequency varying reverse to the varying direction of said first resonance circuit in proportion to the control voltage; and demodulating means for demodulating the second intermediate frequency signal limited in its bandwidth by said bandwidth limiting means to obtain a video signal.

14. The indoor unit according to claim 13, wherein said bandpass filter includes a surface acoustic wave filter.

15. An indoor unit according to claim 13, wherein said first resonance circuit includes an upper limiting side LC series resonance circuit having at least one variable capacity diode as a capacity element, said variable capacity diode varying its capacity value in response to said control voltage, and said second resonance circuit includes a lower limiting side LC series resonance circuit having at least one variable capacity diode as a capacity element, said variable capacity diode being connected reverse to a direction of connection of said variable capacity diode in said upper limiting side LC series resonance circuit, and varying its capacity value in response to said control voltage.

* * * * *